United States Patent
Kim et al.

(10) Patent No.: US 7,790,581 B2
(45) Date of Patent: Sep. 7, 2010

(54) SEMICONDUCTOR SUBSTRATE WITH MULTIPLE CRYSTALLOGRAPHIC ORIENTATIONS

(75) Inventors: Byeong Y. Kim, LaGrangeville, NY (US); Xiaomeng Chen, Poughkeepsie, NY (US); Woo-Hyeong Lee, Poughquag, NY (US); Huilong Zhu, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 853 days.

(21) Appl. No.: 11/306,713

(22) Filed: Jan. 9, 2006

(65) Prior Publication Data

US 2008/0185592 A1   Aug. 7, 2008

(51) Int. Cl.
   *H01L 21/20*   (2006.01)
   *H01L 21/36*   (2006.01)
   *H01L 21/00*   (2006.01)

(52) U.S. Cl. .............. 438/481; 438/150; 438/489; 257/E21.133

(58) Field of Classification Search ............. 438/481, 438/489, 526, 150; 257/E21.133
See application file for complete search history.

(56) References Cited

U.S. PATENT DOCUMENTS

| 6,580,154 | B2 | 6/2003 | Noble et al. |
| 6,830,962 | B1 | 12/2004 | Guarini et al. |
| 6,855,620 | B2 * | 2/2005 | Koike et al. ............. 438/481 |
| 6,885,066 | B2 * | 4/2005 | Miura ................... 257/347 |
| 6,972,478 | B1 * | 12/2005 | Waite et al. ............ 257/627 |
| 2002/0195599 | A1 * | 12/2002 | Yu et al. ................. 257/18 |
| 2004/0029365 | A1 * | 2/2004 | Linthicum et al. ........ 438/481 |
| 2004/0129975 | A1 * | 7/2004 | Koh et al. .............. 257/347 |
| 2004/0195646 | A1 | 10/2004 | Yeo et al. |

* cited by examiner

*Primary Examiner*—Shouxiang Hu
(74) *Attorney, Agent, or Firm*—Scully, Scott, Murphy & Presser, P.C.; H. Daniel Schnurmann

(57) ABSTRACT

A pair of semiconductor structures and a method for fabricating a semiconductor structure each utilize a semiconductor substrate having a first crystallographic orientation, and a dielectric layer located thereupon. The method provides for epitaxially growing a semiconductor layer on the semiconductor substrate to encapsulate the dielectric layer. The method also provides for patterning the semiconductor layer to yield a semiconductor structure that comprises a bulk semiconductor structure and a semiconductor-on-insulator structure, or alternatively a patterned semiconductor layer that straddles the dielectric layer and contacts the semiconductor substrate.

18 Claims, 7 Drawing Sheets

SEMICONDUCTOR SUBSTRATE WITH MULTIPLE CRYSTALLOGRAPHIC ORIENTATIONS

BACKGROUND OF THE INVENTION

1. Field of the Invention

The invention relates generally to semiconductor structures. More particularly, the invention relates to semiconductor structures comprising semiconductor substrates with multiple crystallographic orientations.

2. Description of the Related Art

As semiconductor technology has advanced and semiconductor device dimensions have decreased, various effects merit additional consideration when fabricating semiconductor structures. Charge carrier effects are of particular importance since they often influence semiconductor device operating parameters such as off currents, on currents, drive currents, saturation voltages, switching voltages and the like.

Recent attention has focused on the role of semiconductor substrate crystallographic orientation upon semiconductor device performance. Different crystallographic orientations typically have different physical and electrical properties, such as charge carrier densities and piezoresistance coefficients. In light of those physical and electrical properties, a trend has evolved that involves selection of specific semiconductor substrate crystallographic orientations in order to favor or optimize specific electrical performance within individual semiconductor devices.

As an example, Nobel et al., in U.S. Pat. No. 6,580,154, teaches a method and a resulting structure that provide semiconductor devices located lateral to a (110) silicon semiconductor substrate crystallographic orientation plane to effect enhanced conduction in a <110> direction. The enhanced conduction is realized within the context of hole charge carrier mobility. In addition, Guarini et al., in U.S. Pat. No. 6,830,962 teaches a method for fabricating a semiconductor substrate with multiple crystallographic orientations. The method utilizes a semiconductor-on-insulator substrate having top and bottom semiconductor layers of different crystallographic orientation. The method further utilizes a selective surface etch process, an epitaxial growth process and a separation by implantation of oxygen (SIMOX) process to provide the semiconductor substrate with multiple crystallographic orientations. Finally, Yeo et al., in Pub. No. 2004/0195646 teaches a method for forming a silicon-on-insulator semiconductor substrate with different crystallographic orientations. The method utilizes recrystallization of an amorphous silicon layer.

Desirable are additional methods and structures that allow multiple semiconductor structures and devices to be located upon multiple crystallographic orientations of a single semiconductor substrate.

SUMMARY OF THE INVENTION

The invention provides a pair of semiconductor structures and a method for fabricating a semiconductor structure. The structures and method yield a semiconductor substrate having multiple crystallographic orientations.

The first of the semiconductor structures, which can be used in providing a final semiconductor substrate having multiple crystallographic orientations, comprises a semiconductor substrate having a first orientation. It also comprises a first semiconductor layer having the first orientation located upon and contacting the semiconductor substrate. It also comprises a first stack layer separated from the first semiconductor layer and also located upon the semiconductor substrate. The first stack layer comprises: (1) a first dielectric layer located over the semiconductor substrate; and (2) a second semiconductor layer of the first orientation located over the dielectric layer and not contacting the semiconductor substrate.

The second of the semiconductor structures also comprises a semiconductor substrate having a first orientation. It also comprises a first semiconductor layer having the first orientation located contacting the semiconductor substrate and straddling a first dielectric layer that also contacts the semiconductor substrate.

The method for fabricating the semiconductor structures first provides a semiconductor substrate of a first orientation having a patterned dielectric layer formed thereupon. It also comprises epitaxially growing upon the semiconductor substrate an epitaxial layer that encapsulates the dielectric layer.

The two structures in accordance with the invention, and the method in accordance with the invention, may be augmented with additional structural elements or process steps to provide a semiconductor structure that comprises a semiconductor substrate having a multiplicity of crystallographic orientations. The multiplicity of crystallographic orientations provides an opportunity for engineering specific semiconductor device performance with respect to crystallographic orientation.

BRIEF DESCRIPTION OF THE DRAWINGS

The objects, features and advantages of the invention are understood within the context of the Description of the Preferred Embodiments, as set forth below. The Description of the Preferred Embodiments is understood within the context of the accompanying drawings, which form a material part of this disclosure, wherein.

DESCRIPTION OF THE INVENTION

The invention includes two semiconductor structures and a method for fabricating a semiconductor structure. The two structures and the method assist in providing a semiconductor structure comprising a semiconductor substrate having multiple crystallographic orientations.

FIG. 1 to FIG. 6 show a series of schematic cross-sectional diagrams illustrating the results of progressive stages in fabricating a semiconductor structure in accordance with a first embodiment of the invention.

Figure 1:
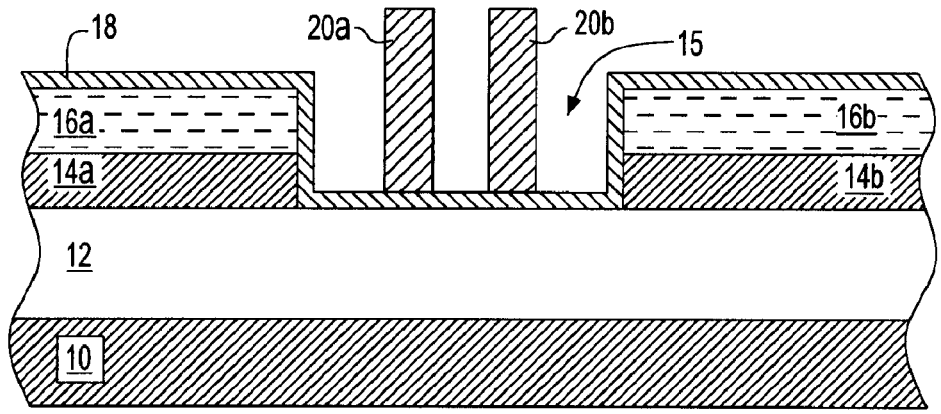
FIG. 1 to FIG. 6 show a series of schematic cross-sectional diagrams illustrating the results of progressive stages in fabricating a semiconductor structure in accordance with a first embodiment of the invention.

FIG. 1 shows a first semiconductor substrate 10. A buried dielectric layer 12 is located upon the first semiconductor substrate 10. A pair of patterned second semiconductor layers 14a and 14b is located upon the buried dielectric layer 12. A pair of patterned first hard mask layers 16a and 16b is located aligned upon the pair of patterned second semiconductor layers 14a and 14b. A stress imparting layer 18 is located upon otherwise exposed portions of the pair of patterned first hard mask layers 16a and 16b, the pair of patterned second semiconductor layers 14a and 14b and the buried dielectric layer 12 exposed within a window 15. Finally, a pair of patterned first photoresist layers 20a and 20b is located upon the stress imparting layer 18 within the window 15 defined by the pair of patterned second semiconductor layers 14a and 14b and the pair of patterned first hard mask layers 16a and 16b.

The foregoing substrate and layers may comprise materials as are generally conventional in the semiconductor fabrication art. They may also be formed while utilizing methods as are generally conventional in the semiconductor fabrication art.

The first semiconductor substrate 10 may comprise any of several semiconductor materials. Non-limiting examples include silicon, germanium, silicon germanium alloy, silicon carbide and silicon germanium carbide alloy materials, as well as compound (i.e., III-IV and II-VI) semiconductor materials. Non-limiting examples of compound semiconductor materials include gallium arsenide, indium arsenide and indium phosphide semiconductor materials. Typically, the first semiconductor substrate 10 is grown and refined from a melt while utilizing a conventional Czochralski method. Typically, it will also comprise a dopant of appropriate polarity and concentration. Alternative methods may also be utilized. Typically, the first semiconductor substrate 10 has a thickness from about 1 to about 3 millimeters.

Within the instant embodiment and the invention, the first semiconductor substrate 10 has a first crystallographic orientation. The first crystallographic orientation may be any of several conventional or non-conventional crystallographic orientations. Non-limiting examples include (001), (010), (011), (100), (110) and (111) crystallographic orientations. Preferably, the first semiconductor substrate 10 has a (110) first crystallographic orientation, which is desirable for a semiconductor substrate for p-FET devices.

The buried dielectric layer 12 may comprise crystalline or non-crystalline oxide, nitride, oxynitride or alternative dielectric materials. The buried dielectric layer 12 may be formed utilizing methods including, but not limited to: thermal annealing methods, chemical vapor deposition methods, physical vapor deposition methods and ion implantation oxidation methods. Typically, the buried dielectric layer 12 has a thickness from about 1000 to about 2000 angstroms.

The pair of patterned second semiconductor layers 14a and 14b may comprise any of the several semiconductor materials disclosed above with respect to the first semiconductor substrate 10. The pair of patterned second semiconductor layers 14a and 14b may comprise the same semiconductor material as the first semiconductor substrate 10 comprises. Alternatively, the pair of patterned second semiconductor layers 14a and 14b, and the semiconductor substrate 10 may comprise different semiconductor materials. Within the instant embodiment and the invention, each of the pair of patterned second semiconductor layers 14a and 14b has a second crystallographic orientation different from the first crystallographic orientation of the first semiconductor substrate 10. The second crystallographic orientation may be selected from the same group of crystallographic orientations as the first crystallographic orientation, as long as the second crystallographic orientation is different from the first crystallographic orientation. Preferably, the second crystallographic orientation is a (100) crystallographic orientation, as is preferred for n-FET devices. Typically, each of the pair of patterned second semiconductor layers 14a and 14b has a thickness from about 500 to about 2000 angstroms.

The pair of patterned first hard mask layers 16a and 16b may comprise hard mask materials such as, but not limited to: nitrides and oxynitrides. They may be formed utilizing methods including, but not limited to: chemical vapor deposition methods, physical vapor deposition methods, ion implantation methods, thermal annealing methods and surface diffusion methods. Typically, the pair of patterned first hard mask layers 16a and 16b comprises a silicon nitride material that has a non-limiting thickness from about 200 to about 2000 angstroms.

The stress imparting layer 18, which is optional within the instant embodiment and the invention, may comprise any of several stress imparting materials, provided that they are compatible with further processing of the semiconductor structure whose schematic cross-sectional diagram is illustrated in FIG. 1. The stress imparting materials are typically either semiconductor materials or dielectric materials. While not necessarily excluded from the invention, conductor materials are generally not preferred. Non-limiting examples of stress imparting materials include nitride materials, oxynitride materials, silicon germanium alloy materials and silicon carbide materials, any of which may be useful when the first semiconductor substrate 10 comprises a silicon semiconductor material. Other stress imparting materials may alternatively be employed, in particular when the first semiconductor substrate 10 comprises other than a silicon semiconductor material. Factors that in general influence stress within a stress imparting layer include, but are not limited to: lattice mismatch, deposition temperature, deposition starting materials and deposition pressure. Typically, the stress imparting layer 18 has a thickness from about 50 to about 300 angstroms. Preferably, the stress imparting layer comprises a silicon carbide material.

Finally, the pair of patterned first photoresist layers 20a and 20b may comprise photoresist materials including, but not limited to: positive photoresist materials, negative photoresist materials and hybrid photoresist materials. The pair of patterned first photoresist layers 20a and 20b is formed utilizing otherwise conventional coating, photoexposure and development processes. Typically, each of the pair of patterned first photoresist layers 20a and 20b has a thickness from about 2000 to about 10000 angstroms.

As is understood by a person skilled in the art, fabrication of the semiconductor structure as illustrated in FIG. 1 starts with a semiconductor-on-insulator semiconductor substrate. It comprises the first semiconductor substrate 10, the buried dielectric layer 12 and a second semiconductor layer from which is patterned the pair of patterned second semiconductor layers 14a and 14b. Semiconductor-on-insulator semiconductor substrates are generally conventional and may be formed while utilizing any of several methods, including but not limited to: layer transfer methods, laminating methods and separation by implantation of oxygen (SIMOX) methods. Given that the foregoing description requires that the first semiconductor substrate 10 has a first crystallographic orientation and the pair of patterned second semiconductor layers 14a and 14b has a second crystallographic orientation different from the first crystallographic orientation, SIMOX methods are typically inapplicable for forming a semiconductor-on-insulator substrate that may be utilized in the instant embodiment.

A blanket first hard mask layer is formed and located upon the semiconductor-on-insulator substrate. In turn a pair of patterned photoresist layers (not illustrated) is formed and located upon the blanket first hard mask layer. They serve as an etch mask for forming the pair of patterned first hard mask layers 16a and 16b from the blanket first hard mask layer and possibly, in part, also the pair of patterned second semiconductor layers 14a and 14b from the second semiconductor layer within the semiconductor-on-insulator substrate. Subsequent to the foregoing etching, the pair of patterned photoresist layers (not illustrated) is then stripped. The stress imparting layer 18 is then formed and located upon the resulting structure including the window 15 defined by the patterned second semiconductor layers 14a and 14b and the patterned first hard mask layers 16a and 16b. The pair of patterned first photoresist layers 20a and 20b is then formed and located upon the stress imparting layer 18 within the window 15.

Figure 2:
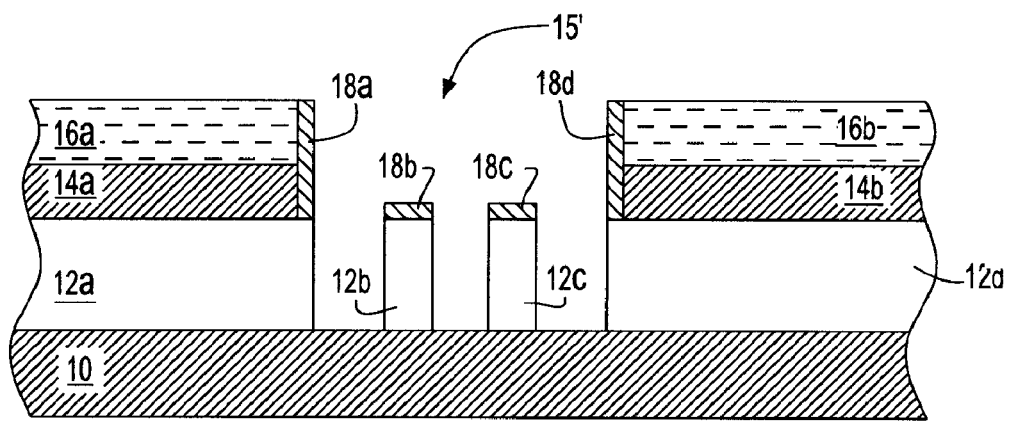

FIG. 2 shows a series of patterned buried dielectric layers 12a, 12b, 12c and 12d located within or adjoining an extended window 15' that now reaches the first semiconductor substrate 10. FIG. 2 also shows a pair of patterned stress imparting layers 18a and 18d located upon the sidewalls of the pair of patterned second semiconductor layers 14a and 14b and the corresponding pair of patterned first hard mask layers 16a and 16b. FIG. 2 finally shows a pair of patterned stress imparting layers 18b and 18c located aligned upon the pair of patterned buried dielectric layers 12b and 12c.

The series of patterned stress imparting layers 18a, 18b, 18c and 18d results from etching the stress imparting layer 18, while utilizing the pair of patterned first photoresist layers 20a and 20b as an etch mask. Similarly the series of patterned buried dielectric layers 12a, 12b, 12c and 12d results from etching the buried dielectric layer 12, while utilizing at least the pair of patterned hard mask layers 16a and 16b, along with the series of patterned stress imparting layers 18a, 18b, 18c and 18d as a mask. Optionally, the pair of patterned first photoresist layers 20a and 20b may also be utilized as the mask when patterning the buried dielectric layer 12 to form the series of patterned buried dielectric layers 12a, 12b, 12c and 12d.

The foregoing patterning is typically effected while utilizing an anisotropic etch method, to avoid undercutting within the series of patterned buried dielectric layers 12a, 12b, 12c and 12d. Under certain circumstances, however, an isotropic etchant may nonetheless alternatively also be employed. The anisotropic etch method is typically a plasma etch method, and requisite etchant gas compositions are selected in accordance with the materials to be etched. When the buried dielectric layer 12 comprises a silicon containing dielectric material, a carbon and fluorine containing etchant gas composition is common. Alternative etchant gas compositions may be utilized.

As is illustrated in FIG. 2, horizontal and uncovered portions of the stress imparting layer 18 are completely etched while utilizing the pair of patterned first hard mask layers 16a and 16b as an etch stop layer. With respect to patterning of the buried dielectric layer 12 to form the series of patterned buried dielectric layers 12a, 12b, 12c and 12d, the first semiconductor substrate 10 is utilized as an etch stop layer. The foregoing patterning yields the extended window 15' in FIG. 2 from the window 15 as illustrated in FIG. 1.

FIG. 2 finally shows the results of stripping the pair of patterned first photoresist layers 20a and 20b from the pair of patterned stress imparting layers 18b and 18c. They may be stripped while utilizing stripping methods and materials as are otherwise generally conventional in the semiconductor fabrication art. Such methods and materials may include, but are not limited to: wet chemical and dry plasma methods and materials, and aggregate methods and materials thereof.

Figure 3:
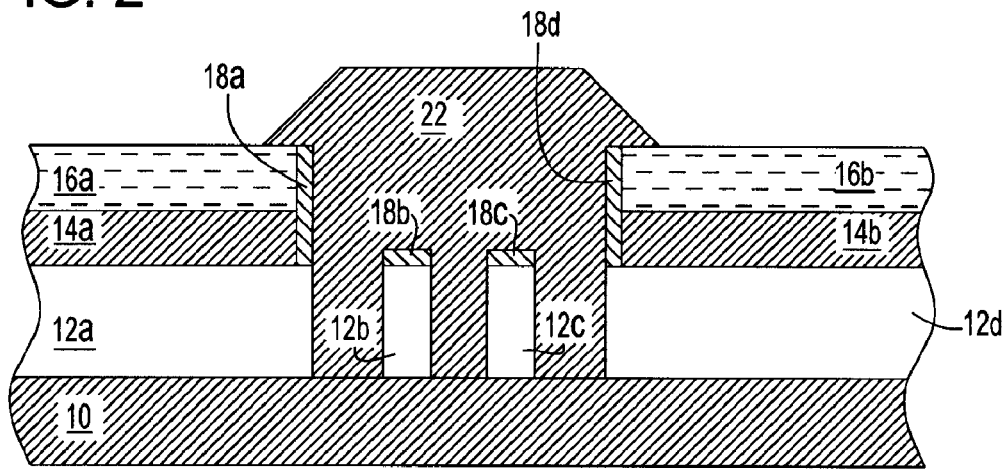

FIG. 3 shows an epitaxial stud layer 22 located within the extended window 15'. It covers and encapsulates the pair of patterned stress imparting layers 18b and 18c and the corresponding pair of patterned buried dielectric layers 12b and 12c aligned thereunder. The epitaxial stud layer 22 is grown while utilizing an epitaxial method. The epitaxial method preserves the first crystallographic orientation of the first semiconductor substrate 10 and replicates the same in the epitaxial stud layer 22. The epitaxial stud layer 22 is grown in a fashion that it converges and encapsulates the pair of patterned buried dielectric layers 12b and 12c and the pair of patterned stress imparting layers 18c and 18d as it grows from the surface of the first semiconductor substrate 10. The epitaxial stud layer 22 typically has a height that extends above the pair of patterned first hard mask layers 16a and 16b. This allows for uniform further processing of the semiconductor structure whose schematic cross-sectional diagram is illustrated in FIG. 3. The epitaxial stud layer 22 may also include dopants of polarity and concentration that are appropriate for further processing of the semiconductor structure whose schematic cross-sectional diagram is illustrated in FIG. 3. The semiconductor structure of FIG. 3 may also be annealed thermally, and optionally within a hydrogen atmosphere, such as to heal therein defects that arise from lateral growth of the epitaxial stud layer 22 when encapsulating the pair of patterned buried dielectric layers 12b and 12c and the pair of patterned stress imparting layers 18b and 18c.

Figure 4:
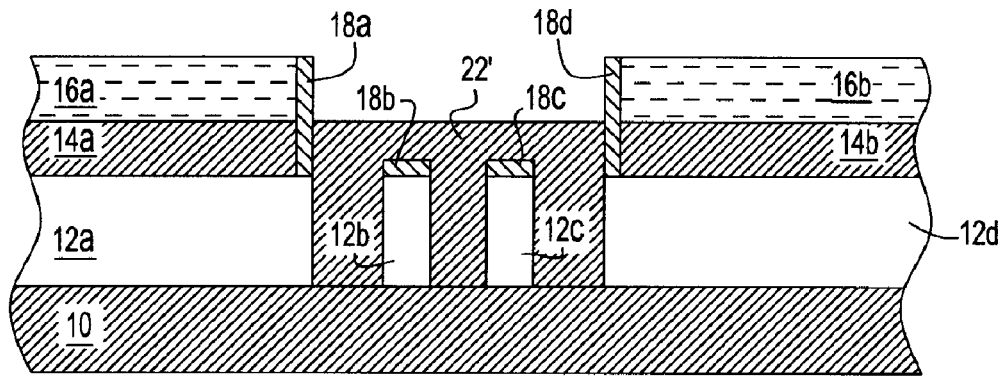

FIG. 4 shows a planarized and etched back epitaxial stud layer 22' located within the extended window 15'. It results from sequentially planarizing and etching back the epitaxial stud layer 22 as illustrated in FIG. 3. The planarizing may be effected while employing methods and materials that are conventional in the semiconductor fabrication art. Such methods may include, but are not limited to: purely mechanical planarizing methods, as well as chemical mechanical polish (CMP) planarizing methods. Chemical mechanical polish planarizing methods are typically preferred. The epitaxial stud layer 22 is typically planarized to be coplanar with the surface of the pair of pattered first hard mask layers 16a and 16b. They typically serve as a planarizing stop layer.

The etching back of the planarized epitaxial stud layer 22 to form the planarized and etched back epitaxial stud layer 22' may be effected wile utilizing etch methods and materials as are conventional in the art. Isotropic etchants, anisotropic etchants or a combination of both types of etchants may be used. Generally correlating therewith, wet chemical etchants, dry plasma etchants or a combination of both types of etchants may be used. Typically, the planarized epitaxial stud layer 22 is etched back to form the planarized and etched back epitaxial stud layer 22' while utilizing a reactive ion etch method having a specificity for the semiconductor material from which is formed the epitaxial stud layer 22 with respect to materials utilized for forming surrounding layers. Typically, the epitaxial stud layer 22 when planarized is etched back to provide a recess equal to a thickness of the pair of patterned first hard mask layers 16a and 16b.

Figure 5:
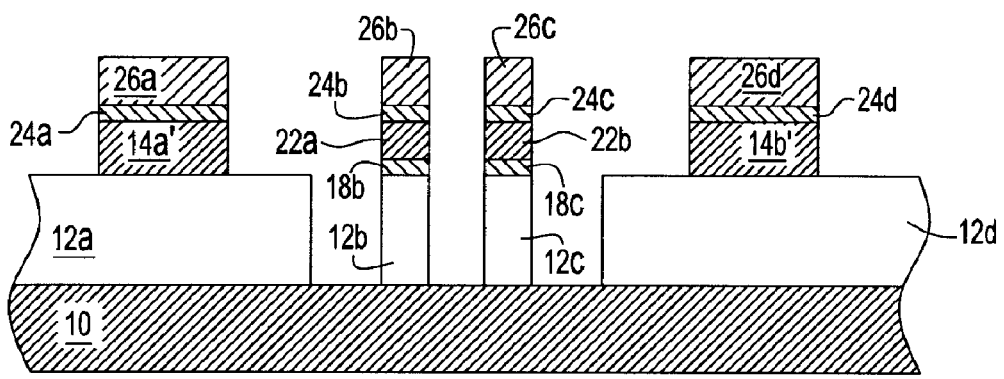

FIG. 5 first shows the results of stripping the pair of patterned first hard mask layers 16a and 16b and the pair of patterned stress imparting layers 18a and 18d from the semiconductor structure whose schematic cross-sectional diagram is illustrated in FIG. 4. They may be stripped while utilizing etchant materials that are appropriate to their compositions. When the pair of patterned first hard mask layers 16a and 16b comprises a silicon nitride or a silicon oxynitride hard mask material, they may be stripped while utilizing a phosphoric acid etchant at elevated temperature. Alternative etchants may be employed.

Although not specifically illustrated in FIG. 5, a blanket second hard mask layer is then formed and located upon exposed portions of at least the pair of patterned second semiconductor layers 14a and 14b and the planarized and etched back epitaxial stud layer 22' (all of which are nominally coplanar). Although also not specifically illustrated in FIG. 5 (but illustrated by implication), a series of patterned second photoresist layers 26a, 26b, 26c and 26d is then formed and located upon the blanket second hard mask layer.

The blanket second hard mask layer may be formed utilizing methods, materials and dimensions analogous, equivalent or identical to the methods, materials and dimensions utilized for forming first hard mask layer from which is patterned the pair of patterned first hard mask layers 16a and 16b. The series of patterned second photoresist layers 26a, 26b, 26c and 26d may be formed utilizing methods, materials and dimensions analogous, equivalent or identical to the methods, materials and dimensions utilized for forming the pair of patterned first photoresist layers 20a and 20b as illustrated in FIG. 1.

Finally, FIG. 5 shows a series of four stack layers that includes one each of a pair of twice patterned second semiconductor layers 14a' and 14b', and a pair of patterned first semiconductor layers 22a and 22b derived from the planarized and etched back epitaxial stud layer 22'. The four stack layers result from an additional patterning of the blanket second hard mask layer, the patterned second semiconductor layers 14a and 14b and the planarized and etched back epitaxial stud layer 22', while utilizing the series of patterned second photoresist layers 26a, 26b, 26c and 26d as an etch mask layer. A first stack layer comprises the patterned buried dielectric layer 12a, a twice patterned second semiconductor layer 14a' and the patterned second hard mask layer 24a. A second stack layer comprises the patterned buried dielectric layer 12b, the patterned stress imparting layer 18b, a patterned first semiconductor layer 22a derived from the planarized and etched back epitaxial stud layer 22' and a patterned second hard mask layer 24b. A third stack layer comprises the patterned buried dielectric layer 12c, the patterned stress imparting layer 18c, a patterned first semiconductor layer 22b derived from the planarized and etched back epitaxial stud layer 22' and a patterned second hard mask layer 24c. A fourth stack layer comprises the patterned buried dielectric layer 12d, a twice patterned second semiconductor layer 14b' and a patterned second hard mask layer 24d.

The instant embodiment intends that each of the pair of patterned first photoresist layers 20a and 20b as illustrated in FIG. 1 has the same area dimensions to thus yield a pair of patterned stress imparting layers 18b and 18c and a pair of patterned buried dielectric layers 12b and 12c of equal area dimensions. The instant embodiment also intends that none of the pair of patterned first semiconductor layers 22a and 22b and the pair of twice patterned second semiconductor layers 14a' and 14b' is of linewidth greater than a patterned buried dielectric layer upon or over which it is located. Thus, the pair of patterned second photoresist layers 26a and 26d will typically have a linewidth contained within the linewidths of the pair of patterned second semiconductor layers 14a and 14b. Also, the pair of patterned second photoresist layers 26b and 26c will typically have a linewidth contained within the linewidths of the pair of patterned stress imparting layers 18b and 18c.

Figure 6:
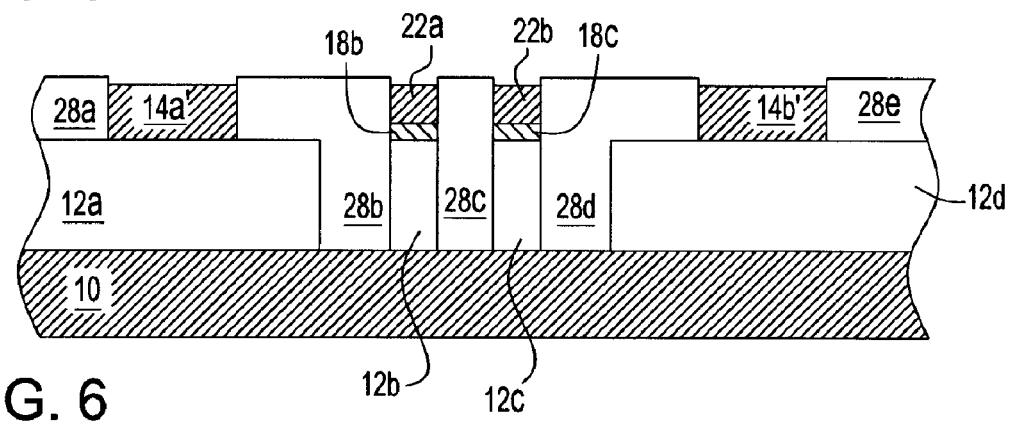

FIG. 6 first shows the results of stripping the series of patterned second photoresist layers 26a, 26b, 26c and 26d from the semiconductor structure illustrated in FIG. 5. The series of patterned second photoresist layers 26a, 26b, 26c and 26d may be stripped utilizing methods and materials analogous, equivalent or identical to the methods and materials utilized for stripping the pair of patterned first photoresist layers 20a and 20b illustrated in FIG. 1 to provide in part the semiconductor structure illustrated in FIG. 2.

FIG. 6 also shows a series of planarized dielectric layers 28a, 28b, 28c, 28d and 28e located interposed between the stack layers as described above, but absent the series of patterned second hard mask layers 24a, 24b, 24c and 24d.

The series of planarized dielectric layers 28a, 28b, 28c, 28d and 28e may comprise any of several dielectric materials. Non-limiting examples include silicon oxide, silicon nitride and silicon oxynitride dielectric materials, as well as composites and laminates thereof. The series of planarized dielectric layers 28a, 28b, 28c, 28d and 28e is typically formed utilizing a blanket dielectric layer deposition and a subsequent planarization. The blanket layer is typically deposited utilizing a chemical vapor deposition or a physical vapor deposition method, although alternate deposition methods may also be used. A high density plasma chemical vapor deposition method yielding a blanket layer comprising a silicon oxide dielectric material is desirable, but the same is not a requirement of the invention. In accordance with other planarized layers within the instant embodiment, the series of planarized dielectric layers 28a, 28b, 28c, 28d and 28e may be planarized while utilizing generally conventional methods. Non-limiting examples of the planarizing methods include purely mechanical methods and chemical mechanical polish (CMP) methods.

As is illustrated by implication within FIG. 6, the series of planarized dielectric layers 28a, 28b, 28c, 28d and 28e is typically planarized while the series of patterned second hard mask layers 24a, 24b, 24c and 24d is in place so that the same may serve as a series of planarizing stop layers. The series of patterned second hard mask layers 24a, 24b, 24c and 24d may then be stripped while utilizing methods and materials analogous, equivalent or identical to the methods and materials employed for stripping the pair of patterned first hard mask layers 16a and 16b as illustrated in FIG. 4 to yield in part the semiconductor structure of FIG. 5. As a result of the foregoing process sequence, which is not limiting to the instant embodiment or the invention, the pair of patterned first semiconductor layers 22a and 22b and the pair of twice patterned second semiconductor layers 14a' and 14b' are recessed beneath the plane of the series of planarized dielectric layers 28a, 28b, 28c, 28d and 28e. Full planarization may be effected by removal of an additional thickness of the planarized dielectric layers 28a, 28b, 28c, 28d and 28e during subsequent process steps used for forming semiconductor devices, such as but not limited to: field effect transistors.

FIG. 6 shows a semiconductor structure in accordance with a first embodiment of the invention. The semiconductor structure comprises a first semiconductor substrate 10 having a first orientation. It also comprises a pair of first stack layers having a pair of patterned buried dielectric layers 12b and 12c located upon the first semiconductor substrate 10, and a pair of patterned first semiconductor layers 22a and 22b having the first orientation located over the pair of patterned buried dielectric layers 12b and 12c and not contacting the first semiconductor substrate 10. Finally, it also comprises a pair of second stack layers having a pair of patterned buried dielectric layers 12a and 12d located upon the first semiconductor substrate 10, and a pair of twice patterned second semiconductor layers 14a' and 14b' having a second orientation different from the first orientation located over the pair of patterned buried dielectric layers 12a and 12d and also not contacting the first semiconductor substrate 10. A pair of stress imparting layers 18b and 18c is interposed between the pair of patterned first semiconductor layers 22a and 22b and corresponding patterned buried dielectric layers 12b and 12c within the first stack layers, but not between the pair of twice patterned second semiconductor layers 14a' and 14b' and the corresponding patterned buried dielectric layers 12a and 12d within the pair of second stack layers.

The first embodiment of the invention provides two separate crystallographic orientations within a single semiconductor substrate. This allows for specific engineering of semiconductor devices with respect to crystallographic orientation on a single semiconductor substrate. The same is desirable since performance characteristics of different semiconductor devices may be enhanced incident to crystallographic orientation of a semiconductor substrate upon which they are located.

FIG. 7 to FIG. 12 show a series of schematic cross-sectional diagrams illustrating the results of progressive stages in fabricating a semiconductor structure in accordance with a second embodiment of the invention.

Figure 7:
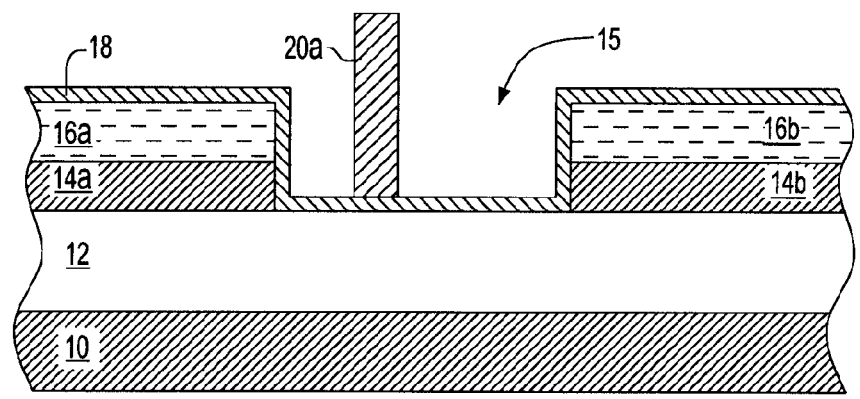
FIG. 7 to FIG. 12 show a series of schematic cross-sectional diagrams illustrating the results of progressive stages in fabricating a semiconductor structure in accordance with a second embodiment of the invention.

The second embodiment utilizes a series of process steps generally analogous with the series of process steps illustrated in FIG. 1 to FIG. 6 for the first embodiment. However, the second embodiment differs insofar as the second embodiment utilizes only a single patterned first photoresist layer 20a as illustrated in FIG. 7, rather than the pair of patterned first photoresist layers 20a and 20b as illustrated in FIG. 1.

Figure 8:
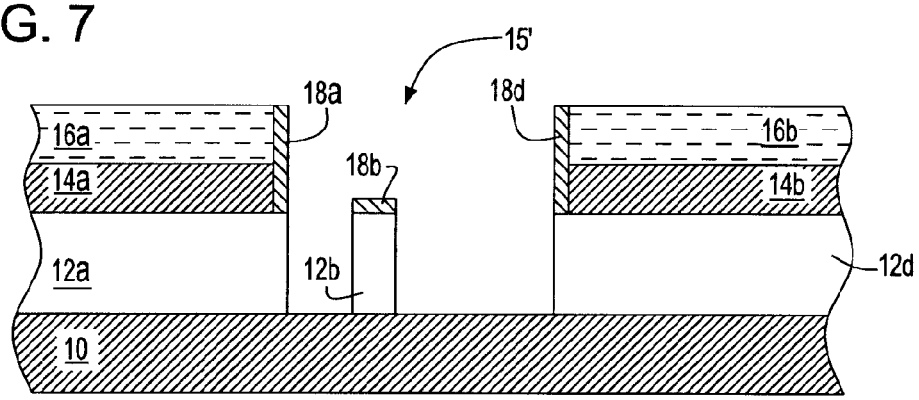

Resulting from absence of the patterned first photoresist layer 20b, FIG. 8 also contrasts with FIG. 2 by the absence of a patterned stress imparting layer 18c and a patterned buried oxide layer 12c.

Figure 9:
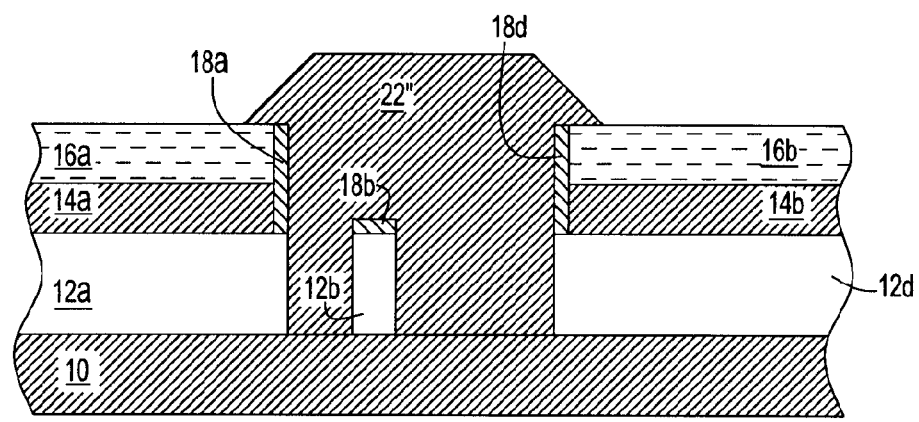
Figure 10:
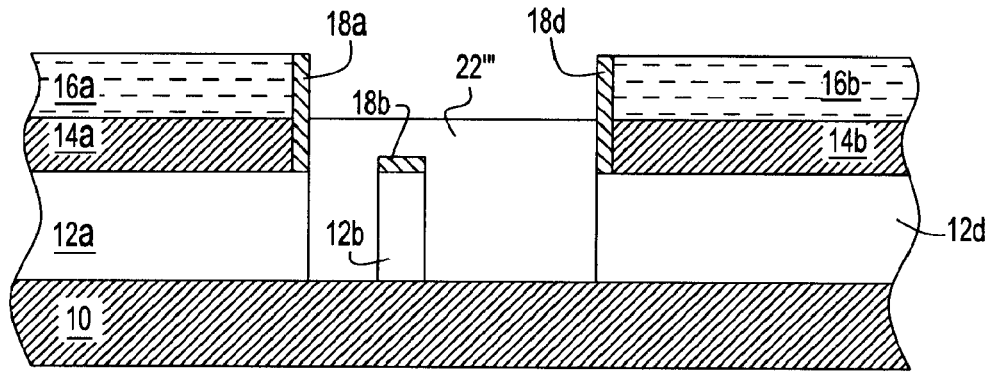
Figure 11:
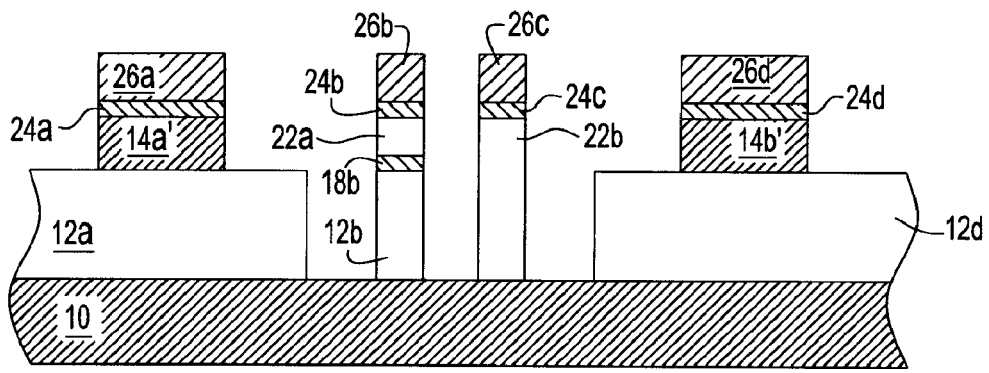

Resulting from absence of the patterned buried oxide layer 12c and the patterned stress imparting layer 18c, the epitaxial stud layer 22" in FIG. 9 and the planarized and etched back epitaxial stud layer 22"' in FIG. 10 are shaped differently from the epitaxial stud layer 22 in FIG. 3 and the planarized and etched back epitaxial stud layer 22' in FIG. 4.

The series of patterned second photoresist layers 26a, 26b, 26c and 26d and the series of patterned second hard mask layers 24a, 24b, 24c and 24d as illustrated in FIG. 8 are located and sized identically as illustrated in FIG. 5 within the first embodiment. Thus, given the absence of the patterned stress imparting layer 18c and the patterned buried dielectric layer 12c, a patterned first semiconductor layer 22b' is formed that contacts the first semiconductor substrate 10 from which it was epitaxially grown.

Figure 12:
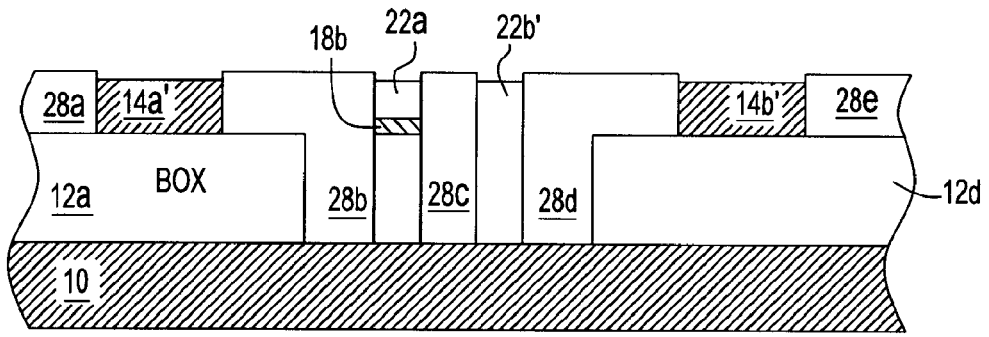
Figure 13:
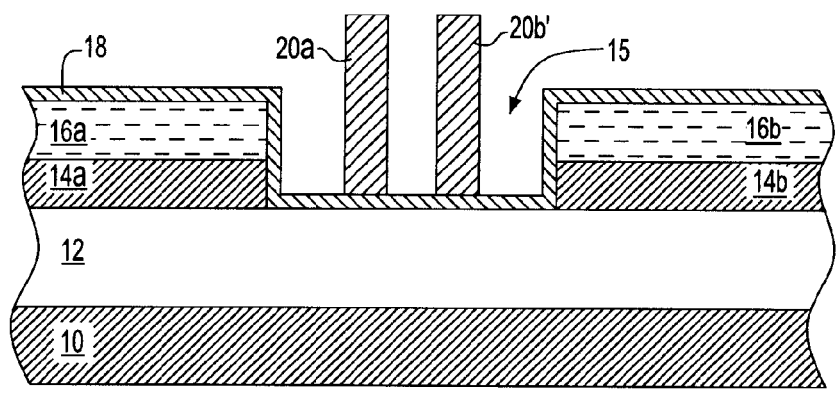
FIG. 13 to FIG. 18 show a series of schematic cross-sectional diagrams illustrating the results of progressive stages in fabricating a semiconductor structure in accordance with a third embodiment of the invention.

FIG. 12 corresponds with FIG. 6, and again adds a series of planarized dielectric layers 28a, 28b, 28c, 28d and 28e interposed in part and isolating the pair of twice patterned second semiconductor layers 14a' and 14b' and the pair of patterned first semiconductor layers 22a and 22b'.

FIG. 12 shows a schematic cross-sectional diagram of a semiconductor structure in accordance with a second embodiment of the invention. The second embodiment also provides a single semiconductor substrate with two pair of crystallographic orientations. One of two pair of crystallographic orientations comprises a pair of twice patterned second semiconductor layers 14a' and 14b' located upon a pair of patterned buried dielectric layers 12a and 12d absent intervening stress imparting layers. A first of the other pair of two crystallographic orientations comprises the patterned first semiconductor layer 22a located over the patterned buried dielectric layer 12b and not contacting the first semiconductor substrate 10. The other of the second pair of orientations comprises the patterned first semiconductor layer 22b' located upon and contacting the first semiconductor substrate 10.

FIG. 13 to FIG. 18 show a series of schematic cross-sectional diagrams illustrating the results of progressive stages in fabricating a semiconductor structure in accordance with a third embodiment of the invention.

The third embodiment also correlates with the first embodiment. However, the third embodiment differs from the first embodiment by utilizing a patterned first photoresist layer 20b' that has a linewidth less than the patterned first photoresist layer 20b as illustrated in FIG. 1. For comparison purposes, the patterned first photoresist layer 20b might have a linewidth from about 0.2 to 1.0 microns, while the patterned first photoresist layer 20b' might have a linewidth from about 0.1 to about 0.7 microns.

Figure 14:
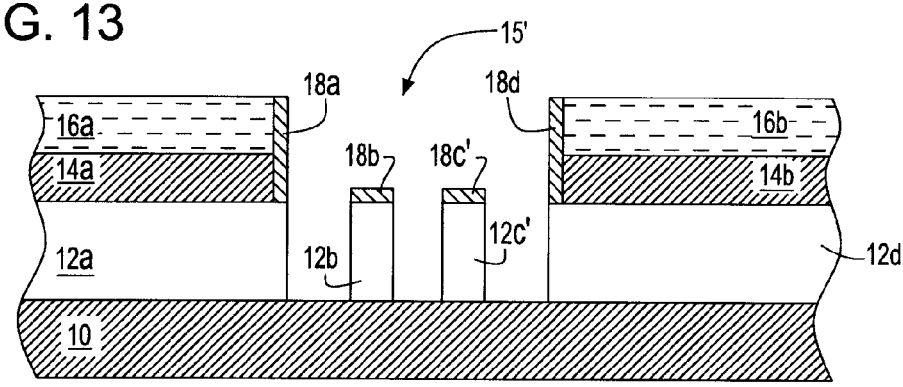
Figure 15:
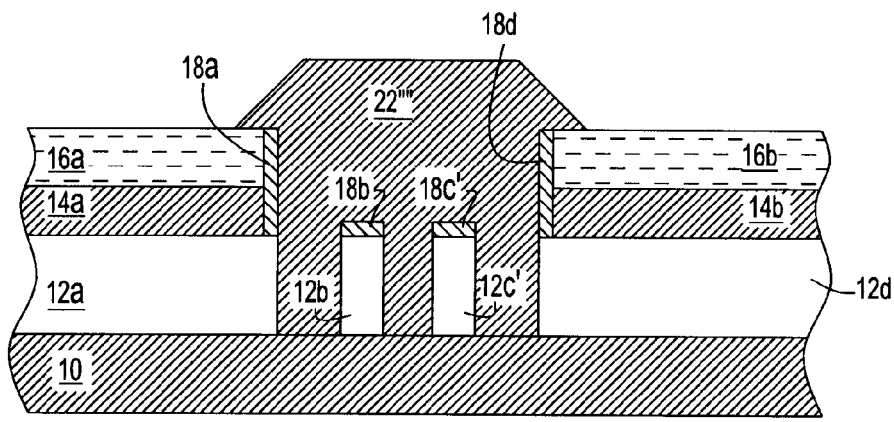
Figure 16:
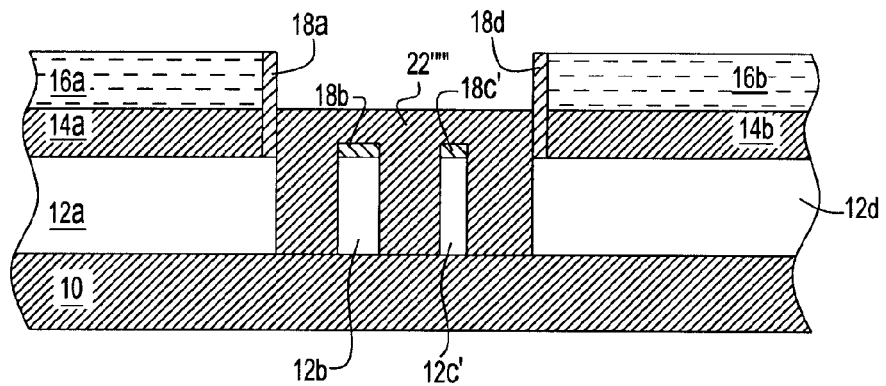
Figure 17:
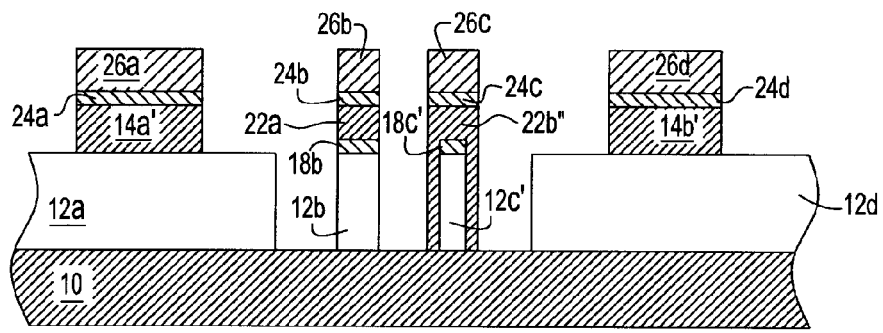

The narrower linewidth of the patterned first photoresist layer 20b' leads to a narrower linewidth of a patterned stress imparting layer 18c' and a patterned buried dielectric layer 12c' as illustrated in FIG. 14. It also leads to different dimensions of the epitaxial stud layer 22"" as illustrated in FIG. 15 and the planarized and etched back epitaxial stud layer 22""' as illustrated in FIG. 16.

Within the third embodiment, the series of patterned second photoresist layers 26a, 26b, 26c and 26d and the series of patterned second hard mask layers 24a, 24b, 24c and 24d are again the same in dimensions (in particular with respect to linewidth dimensions) as utilized in the second embodiment and the first embodiment. Thus, in FIG. 17 a patterned first semiconductor layer 22b" is etched from the planarized and etched back epitaxial stud layer 22"" in a shape that provides that the patterned first semiconductor layer 22b" straddles the patterned stress imparting layer 18c' and the patterned buried dielectric layer 12c', while also contacting the first semiconductor substrate 10.

Figure 18:
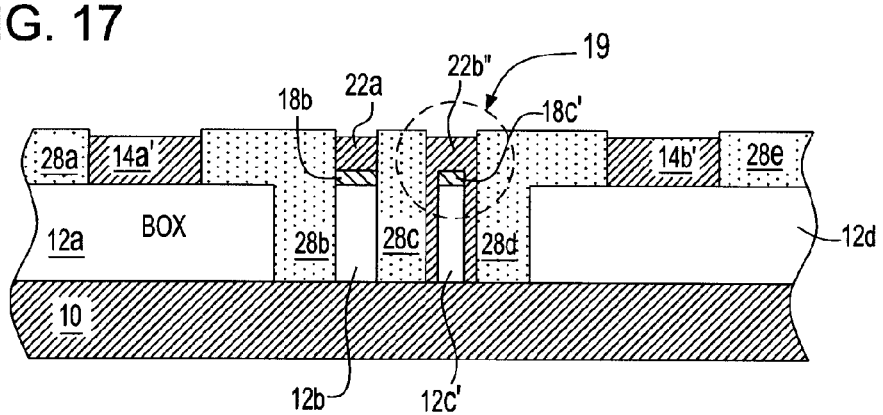

Analogously with the second embodiment as illustrated in FIG. 12 and the first embodiment as illustrated in FIG. 6, the third embodiment as illustrated in FIG. 18 provides for back-filling and planarizing to form the series of planarized dielectric layers 28a, 28b, 28c, 28d and 28e.

Similarly with the first embodiment and the second embodiment, the third embodiment also provides a semiconductor structure comprising a semiconductor substrate having two pair of separate crystallographic orientations. A first of the two pair is provided as semiconductor-on-insulator structures (e.g., twice patterned second semiconductor layers 14a' and 14b' located upon the pair of patterned buried dielectric layers 12a and 12d, absent stress imparting layers and not contacting the first semiconductor substrate 10). Of the second pair, one is provided as a semiconductor-on-insulator structure (i.e., patterned first semiconductor layer 22a located upon patterned stress imparting layer 18b and patterned buried dielectric layer 12b and not contacting the first semiconductor substrate 10) and the other is provided having both bulk semiconductor properties and semiconductor-on-insulator properties (i.e., patterned first semiconductor layer 22b" that straddles the patterned stress imparting layer 18c' and the patterned buried dielectric layer 12c' while contacting the first semiconductor substrate 10).

Figure 19:
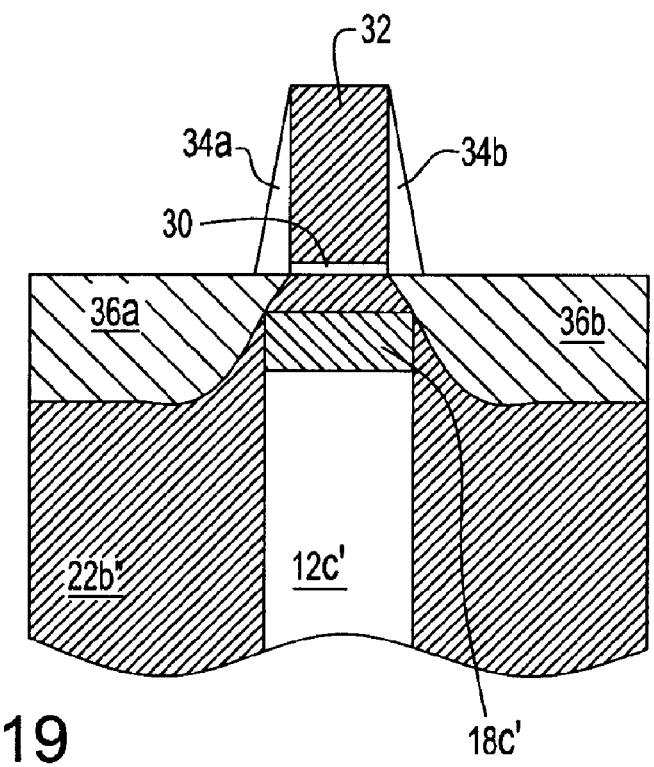
FIG. 19 and FIG. 20 show a pair of schematic cross-sectional diagrams illustrating a field effect transistor device fabricated within the semiconductor structure in accordance with the third embodiment of the invention.
Figure 20:
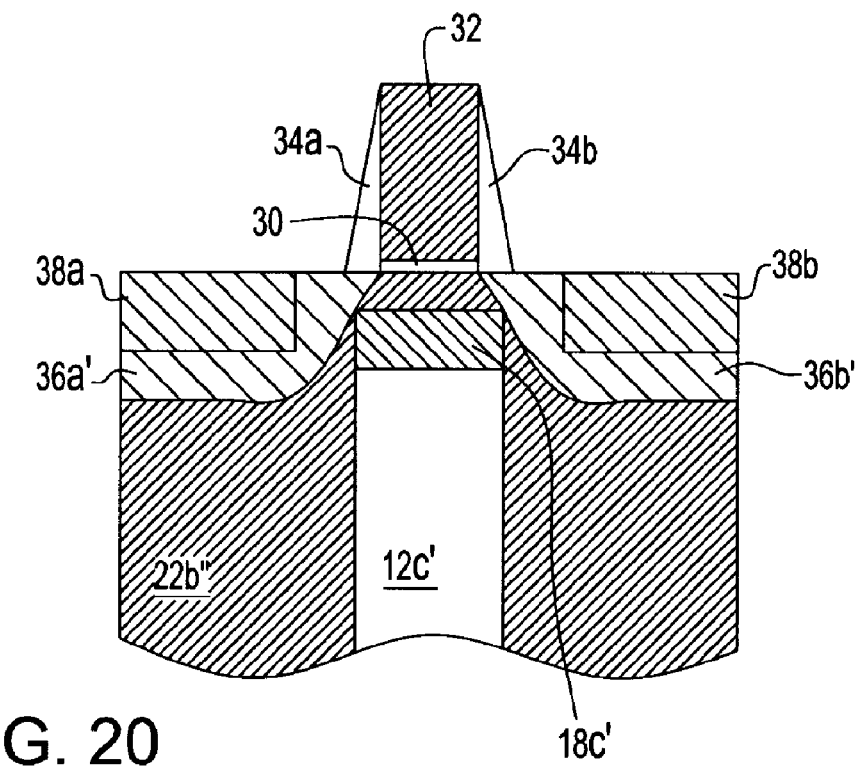

FIG. 19 and FIG. 20 illustrate further detail with respect to locating a field effect transistor device upon a portion of the patterned first semiconductor layer 22b" within the dashed circle 19 illustrated in FIG. 18. The embodiments and the invention are clearly not limited to locating a semiconductor device in only that location. Rather semiconductor devices are intended to be located in any and all of the active semiconductor regions within any of the embodiments of the invention.

FIG. 19 shows the patterned first semiconductor layer 22b" that straddles the patterned stress imparting layer 18c' and the patterned buried dielectric layer 12c', both of narrower linewidth. The patterned stress imparting layer 18c' is located beneath a channel region of the field effect transistor.

The field effect transistor comprises a gate dielectric layer 30 located upon the patterned first semiconductor layer 22b'''. A gate electrode 32 is aligned upon the gate dielectric layer 30, although such exact alignment is not a requirement of the embodiment or the invention. A pair of spacer layers 34a and 34b is located laterally adjacent and adjoins a pair of opposite sidewalls of the gate electrode 32 and the gate dielectric layer 30. Finally, a pair of source/drain regions 36a and 36b is located within the patterned first semiconductor layer 22b''' and nominally separated by the gate electrode 32.

Each of the foregoing structures may comprise materials, and be formed while utilizing methods, as are otherwise generally conventional in the semiconductor fabrication art.

For example, the gate dielectric layer 30 may comprise dielectric materials such as, but not limited to: oxides, nitrides and oxynitrides (generally of silicon and/or germanium) having a dielectric constant from about 4 to about 20, as measured in vacuum. The gate dielectric layer may additionally or alternatively comprise generally higher dielectric constant dielectric materials having a dielectric constant from about 20 to at least about 100. These higher dielectric constant dielectric materials may include, but are not limited to: hafnium oxides, hafnium silicates, aluminum oxides, titanium oxides, lanthanum oxides, barium strontium titanates (BSTs) and lead zirconate titanates (PZTs). The invention is not limited to any of the foregoing dielectric materials for forming the gate dielectric layer 30. The gate dielectric layer 30 may be formed utilizing thermal oxidation, thermal nitridation, chemical vapor deposition, physical vapor deposition or alternative methods. Typically, the gate dielectric layer 30 when formed of a thermal silicon oxide material has a thickness from about 10 to about 70 angstroms.

The gate electrode 32 typically comprises a doped polysilicon material (i.e., having a dopant concentration from about 1e18 to about 1e22 dopant atoms per cubic centimeter). Other gate conductor materials may, however, alternatively be utilized. Such alternative gate electrode materials may include, but are not limited to: metals, metal alloys, metal suicides and metal nitrides, as well as laminates thereof and composites thereof. The foregoing materials may be deposited employing methods as are also conventional in the semiconductor fabrication art. Non-limiting examples of methods include chemical vapor deposition methods and physical vapor deposition methods. Typically, the gate electrode 32 has a thickness from about 500 to about 1500 angstroms.

The pair of spacer layers 34a and 34b typically comprises oxide, nitride or oxynitride materials, or alternatively multilayer laminates thereof. Alternatively, the pair of spacer layers 34a and 34b may comprise a conductor material, or less desirable a semiconductor material. They are typically formed while utilizing a spacer material layer deposition and anisotropic etch method as is otherwise generally conventional in the art.

The pair of source/drain regions 36a and 36b is typically formed while utilizing a two step ion implantation method. The two step method utilizes the gate dielectric layer 30 and the gate electrode 32 as a mask, either with or without the pair of spacer layers 34a and 34b. Typically, the pair of source/drain regions 36a and 36b is implanted with an appropriate dopant to a maximum concentration from about 1e20 to about 1e22 dopant atoms per cubic centimeter.

As is illustrated in FIG. 19, the patterned stress imparting layer 18c' is located beneath the channel region of the field effect transistor. In that location, it optimally influences charge carrier mobility to effect enhanced performance of the field effect transistor.

FIG. 20 shows a modification to the field effect transistor of FIG. 19. FIG. 20 shows a pair of stress imparting source/drain layers 38a and 38b located within a pair of etched source/drain regions 36a' and 36b'. The pair of stress imparting source/drain layers 38a and 38b may be utilized to impart further stress, and/or a different type of stress, into the channel region beneath the gate electrode 30. Typically, the pair of stress imparting source/drain layers 38a and 38b comprises a silicon germanium alloy material when the patterned first semiconductor layer 22b'' comprises a silicon semiconductor material. Under those circumstances, a lattice mismatch between the silicon-germanium alloy material and the silicon material intrinsically provides a stress into the channel region beneath the gate electrode 32. The embodiment and the invention are not, however, limited to the foregoing materials combination. Rather, any appropriate stress imparting material may be utilized for the pair of stress imparting source/drain layers 38a and 38b.

The semiconductor structure of FIG. 20 may be formed from the semiconductor structure of FIG. 19 by using the gate electrode 30 (possibly with a separate capping layer) with the pair of spacer layers 34a and 34b as a mask to etch a pair of self aligned trenches that comprise in part the pair of etched source/drain regions 36a' and 36b'. The pair of stress imparting source/drain layers 38a and 38b comprising a silicon-germanium alloy material may be epitaxially deposited within the pair of etched source/drain regions 36a' and 36b'. Typically a germanium content from about 20 to about 30 atom percent is utilized. Alternative stress imparting materials may also be utilized provided that they are compatible with the foregoing processing scheme. Alternative processing schemes are also in accordance with the invention whether or not they are self aligned.

The semiconductor structure of FIG. 20 may also utilize structures such as silicide layers, capping layers and implant regions such as halo implant regions, to provide enhanced performance of the field effect transistor. In addition, the invention is not limited to only a field effect transistor located upon one of more crystallographic orientation specific active regions within a single semiconductor substrate. The invention also contemplates other active and passive devices, such as but not limited to: bipolar transistors, biCMOS transistors, diodes, resistors and capacitors.

The preferred embodiments of the invention are illustrative of the invention rather than limiting of the invention. Revisions and modifications may be made to methods, materials, structures and dimensions used for forming a semiconductor structure in accordance with the preferred embodiments of the invention, while still providing a semiconductor structure in accordance with the invention, further in accordance with the accompanying claims.

What is claimed is:

1. A method for fabricating a semiconductor structure comprising:
   providing a semiconductor substrate of a first crystallographic orientation having a buried dielectric layer formed upon the semiconductor substrate and a patterned semiconductor layer formed upon the buried dielectric layer, said patterned semiconductor layer having at least one window that exposes a portion of the buried dielectric layer;
   patterning said exposed portion of the buried dielectric layer to provide at least one patterned buried dielectric layer located on said semiconductor substrate within said at least one window in said patterned semiconductor layer; and epitaxially growing upon the semiconductor substrate an epitaxial layer that encapsulates the at least one patterned buried dielectric layer within said at least one window, said epitaxial layer is also located on sidewalls of the patterned semiconductor layer.

2. The method of claim 1 further comprising patterning the epitaxial layer to form a patterned epitaxial layer over the at least one patterned buried dielectric layer.

3. The method of claim 2 wherein the patterned epitaxial layer does not contact the semiconductor substrate.

4. The method of claim 2 wherein the patterned epitaxial layer contacts the semiconductor substrate.

5. The method of claim 2 further comprising forming a stress imparting layer interposed between the at least one patterned buried dielectric layer and the patterned epitaxial layer.

6. The method of claim 5 wherein said stress imparting layer is selected from a semiconductor material and a dielectric material.

7. The method of claim 1 further comprising patterning the epitaxial layer to form two patterned epitaxial layers, one contacting the semiconductor substrate and the other not contacting the semiconductor substrate.

8. The method of claim 7 wherein the patterned epitaxial layer that contacts the semiconductor substrate also encapsulates the dielectric layer.

9. The method of claim 7 wherein the patterned epitaxial layer that contacts the semiconductor substrate does not encapsulate the dielectric layer.

10. The method of claim 1 further comprising annealing the epitaxial layer to heal defect that arise during epitaxial growth.

11. The method of claim 10 wherein said annealing is performed in a hydrogen atmosphere.

12. A method for fabricating a semiconductor structure comprising:

providing a semiconductor substrate of a first crystallographic orientation having a buried dielectric layer formed upon the semiconductor substrate and a semiconductor layer formed upon a portion of the buried dielectric layer;

patterning the semiconductor layer forming a pair of patterned semiconductor layers located on said buried dielectric layer, wherein a window is present between the pair of patterned semiconductor layers exposing a portion of the underlying buried dielectric;

patterning the exposed portion of the buried dielectric layer to provide a plurality of patterned buried dielectric layers located on said semiconductor substrate; within the window; and epitaxially growing upon the semiconductor substrate an epitaxial layer that encapsulates the plurality of patterned buried dielectric layers within said window, said epitaxial layer is also located on sidewalls of the pair of patterned semiconductor layer.

13. The method of claim 12 further comprising patterning the epitaxial layer to form a patterned epitaxial layer over the patterned buried dielectric layers within the window.

14. The method of claim 13 wherein the patterned epitaxial layer does not contact the semiconductor substrate.

15. The method of claim 13 further comprising forming a stress imparting layer interposed between the patterned buried dielectric layers and the patterned epitaxial layer within the window.

16. The method of claim 15 wherein said stress imparting layer is selected from a semiconductor material and a dielectric material.

17. The method of claim 13 further comprising annealing the epitaxial layer to heal defects that arise during epitaxial growth.

18. The method of claim 17 wherein said annealing is performed in a hydrogen atmosphere.

* * * * *